United States Patent
Emesh et al.

(10) Patent No.: US 7,033,464 B2
(45) Date of Patent: Apr. 25, 2006

(54) APPARATUS FOR ELECTROCHEMICALLY DEPOSITING A MATERIAL ONTO A WORKPIECE SURFACE

(75) Inventors: Ismail Emesh, Gilbert, AZ (US); Saket Chadda, Sunnyvale, CA (US)

(73) Assignee: SpeedFam-IPEC Corporation, Chandler, AZ (US)

( * ) Notice: Subject to any disclaimer, the term of this patent is extended or adjusted under 35 U.S.C. 154(b) by 160 days.

(21) Appl. No.: 10/305,860

(22) Filed: Nov. 27, 2002

(65) Prior Publication Data

US 2003/0127320 A1    Jul. 10, 2003

Related U.S. Application Data

(63) Continuation-in-part of application No. 09/832,657, filed on Apr. 11, 2001, now Pat. No. 6,572,755.

(51) Int. Cl.
    *C25D 17/00*      (2006.01)

(52) U.S. Cl. ............... 204/198; 204/224 R; 204/224 M
(58) Field of Classification Search ................ 204/198, 204/224 R, 224 M
See application file for complete search history.

(56) References Cited

U.S. PATENT DOCUMENTS

| | | | |
|---|---|---|---|
| 3,779,887 A | 12/1973 | Gildone | |
| 4,713,149 A | 12/1987 | Hoshino | |
| 4,793,895 A | 12/1988 | Kaanta et al. | |
| 5,081,421 A | 1/1992 | Miller et al. | |
| 5,492,594 A | 2/1996 | Burke et al. | |
| 5,723,387 A | 3/1998 | Chen | |
| 5,807,165 A | 9/1998 | Uzoh et al. | |
| 5,911,619 A | 6/1999 | Uzoh et al. | |
| 6,004,880 A | 12/1999 | Liu et al. | |
| 6,017,437 A | 1/2000 | Ting et al. | |
| 6,066,030 A | 5/2000 | Uzoh | |
| 6,090,239 A | 7/2000 | Liu et al. | |
| 6,110,011 A * | 8/2000 | Somekh et al. | ............... 451/28 |
| 6,121,152 A | 9/2000 | Adams et al. | |
| 6,132,586 A | 10/2000 | Adams et al. | |
| 6,143,155 A | 11/2000 | Adams et al. | |
| 6,171,467 B1 | 1/2001 | Weihs et al. | |
| 6,176,992 B1 | 1/2001 | Talieh | |
| 6,197,181 B1 | 3/2001 | Chen | |
| 6,251,236 B1 | 6/2001 | Stevens | |
| 6,258,223 B1 | 7/2001 | Cheung et al. | |
| 6,294,059 B1 | 9/2001 | Hongo et al. | |
| 6,328,872 B1 | 12/2001 | Talieh et al. | |
| 6,423,636 B1 * | 7/2002 | Dordi et al. | ................. 438/678 |
| 6,482,307 B1 * | 11/2002 | Ashjaee et al. | ............. 205/103 |
| 6,613,200 B1 * | 9/2003 | Li et al. | ..................... 204/198 |

* cited by examiner

*Primary Examiner*—Roy King
*Assistant Examiner*—W. T. Leader
(74) *Attorney, Agent, or Firm*—Snell & Wilmer L.L.P.

(57) ABSTRACT

A multi-process workpiece apparatus is disclosed. The multi-process workpiece apparatus includes an electrochemical deposition apparatus which has a wafer contacting surface having at least one electrical conductor disposed therein. The multi-process workpiece apparatus also includes a planarization apparatus and at least one workpiece handling robot configured to transport a workpiece from the electrochemical deposition apparatus to the planarization apparatus.

18 Claims, 8 Drawing Sheets

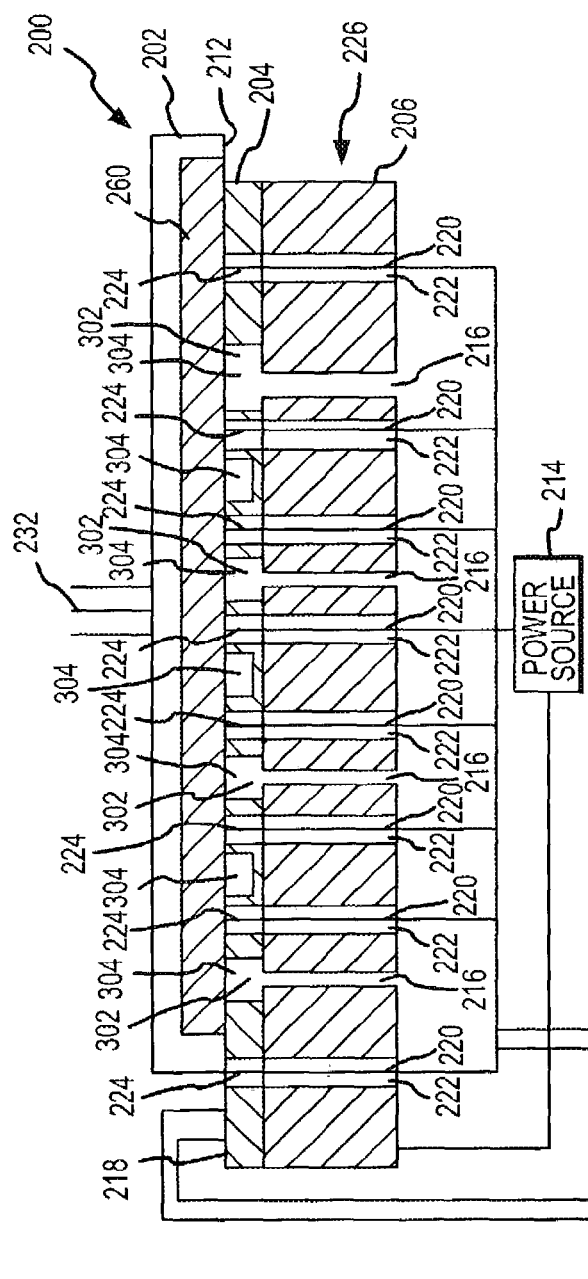
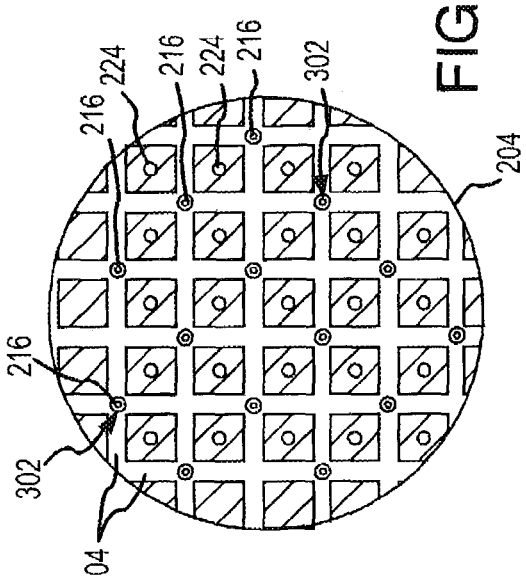
FIG. 4
FIG. 5

APPARATUS FOR ELECTROCHEMICALLY DEPOSITING A MATERIAL ONTO A WORKPIECE SURFACE

CROSS REFERENCE TO RELATED APPLICATIONS

This application is a continuation in part of application Ser. No. 09/832,657, filed Apr. 11, 2001, now U.S. Pat. No. 6,572,755, the entire contents of which are hereby incorporated by reference.

TECHNICAL FIELD

The present invention relates, generally, to techniques for depositing conductive material onto a workpiece, such as a semiconductor wafer. More particularly, the invention relates to an apparatus for multi-stage processing of a workpiece, including the substantially uniform electrochemical deposition of the conductive material onto the workpiece surface, followed by subsequent processing of the workpiece surface.

BACKGROUND

Microelectronic circuits generally include conductive features such as via plugs, metal lines, and the like to interconnect various portions or layers of the circuit. The conductive features of the microelectronic circuits include conductive material such as metal and often include a barrier material to reduce unwanted diffusion of the conductive material and promote adhesion between the conductive material and an adjacent layer of the circuit.

Aluminum is often used to form conductive features because aluminum features are relatively easy to manufacture using conventional deposition (e.g., chemical vapor deposition) and etch (e.g., reactive ion etch) techniques. While use of aluminum to form conductive features is adequate for some circuits, the use of aluminum to form conductive features becomes increasingly problematic as the size of the conductive feature decreases. In particular, as the size of the conductive feature decreases, the current density through the feature generally increases and thus the feature becomes increasingly susceptible to electromigration, i.e., the mass transport of metal due to the current flow. Electromigration may cause short circuits where the metal accumulates, opens where the metal has been depleted, or other circuit failures. Similarly, increased conductive feature resistance may cause unwanted device problems such as excess power consumption or heat generation.

Recently, techniques have been developed to form conductive features comprising copper, which is less susceptible to electromigration and which exhibits a lower resistivity than aluminum. Because copper does not readily form volatile or soluble compounds, the copper conductive features are often formed using damascene technology. More particularly, the copper conductive features are formed by creating a via within an insulating material, blanket depositing a barrier layer onto the surface of the insulating material and into the via, blanket depositing a seed layer of copper onto the barrier layer, electrodepositing a copper layer onto the seed layer to fill the via, and removing any excess barrier material and copper from the surface of the insulating material using chemical mechanical polishing. During the electrodeposition process, additives such as leveling agents are continuously or regularly added to the plating bath to reduce formation of voids within the conductive features. Such leveling agents may affect the grain boundaries of the deposited material, necessitating a subsequent anneal process to obtain the desired material properties.

Forming copper conductive features according to the method described above can be relatively expensive, in part, because each material deposition and removal step is typically carried out using dedicated equipment. Further, once conductive features are formed, it may be necessary to subject the wafer to further processing. Again, however, such additional processing is often conducted at remote, dedicated equipment stations. A system configuration that requires that stages of processing be carried out at remote stations on dedicated equipment may result in higher costs and loss of throughput.

Accordingly, an improved apparatus for electrochemically depositing a metal film is needed. There is also a need for an apparatus that provides for electrochemical deposition and polishing of a workpiece and additional multi-stage processing.

SUMMARY OF THE INVENTION

The present invention provides improved apparatus for forming conductive features on a surface of a workpiece. More particularly, the invention provides a multi-stage apparatus capable of both depositing material onto a surface of a workpiece and polishing the workpiece surface.

In accordance with an exemplary embodiment of the present invention, a multi-process workpiece apparatus is provided. The multi-process workpiece apparatus includes an electrochemical deposition apparatus that includes a wafer contacting surface having at least one electrical conductor disposed therein. The multi-process workpiece apparatus also includes a planarization apparatus and at least one workpiece handling robot configured to transport a workpiece from the electrochemical deposition apparatus to the planarization apparatus.

In accordance with a further exemplary embodiment of the invention, a multi-process workpiece apparatus includes an electrochemical deposition apparatus, a wet etching apparatus and at least one workpiece handling robot configured to transport a workpiece from the electrochemical deposition apparatus to the wet etching apparatus. The electrochemical deposition apparatus has a polishing surface having at least one electrical conductor disposed therein.

In accordance with another exemplary embodiment of the invention, a multi-process workpiece apparatus includes an electrochemical deposition apparatus, a planarization apparatus and at least one workpiece handling robot. The planarization apparatus includes a workpiece contacting surface having at least one electrical conductor disposed therein. The at least one workpiece handling robot is configured to transport a workpiece from the electrochemical deposition apparatus to the planarization apparatus.

In accordance with yet a further exemplary embodiment of the invention, a multi-process workpiece apparatus includes an electrochemical deposition apparatus having a workpiece contacting surface formed of an electrically insulating material. The workpiece contacting surface has an exposed surface for contacting a metal-coated surface of a workpiece. The multi-process workpiece apparatus also includes a planarization apparatus, a first transporter and a second transporter. The first transporter is configured to transport a workpiece from the electrochemical deposition apparatus to the planarization apparatus following a deposition process without contaminating the planarization apparatus with a residue from the deposition process. The second transporter is configured to transport a workpiece to the electrochemical deposition apparatus without introducing contaminants to the workpiece.

In accordance with yet another exemplary embodiment of the invention, an electrochemical deposition apparatus for depositing material onto a surface of a workpiece is provided. The electrochemical deposition apparatus includes a platen assembly having a platen, a workpiece contacting surface disposed proximate to the platen, and at least one electrical conductor disposed proximate to the workpiece contacting surface. The electrochemical deposition apparatus also includes a workpiece carrier configured to carry a workpiece and position the workpiece proximate to the workpiece contacting surface and the at least one electrical conductor. The electrochemical deposition apparatus also includes a power supply coupled to the platen and the at least one electrical conductor.

In accordance with yet a further exemplary embodiment of the invention, a workpiece polishing apparatus for polishing a workpiece is provided. The workpiece polishing apparatus includes a platen assembly having a platen, a workpiece contacting surface disposed proximate to the platen, and at least one electrical conductor disposed proximate to the workpiece contacting surface. The workpiece polishing apparatus also includes a planarization apparatus and at least one workpiece handling robot configured to transport a workpiece from the electrochemical deposition apparatus to the planarization apparatus.

In accordance with yet another exemplary embodiment of the invention, a multi-process workpiece apparatus for polishing a workpiece includes an electrochemical deposition apparatus, a wet etching apparatus and at least one workpiece handling robot. The electrochemical deposition apparatus has a platen assembly that includes a platen, a workpiece contacting surface disposed proximate to the platen, and at least one electrical conductor disposed proximate to the workpiece contacting surface. The at least one workpiece handling robot is configured to transport a workpiece from the electrochemical deposition apparatus to the wet etching apparatus.

BRIEF DESCRIPTION OF THE DRAWINGS

Exemplary embodiments of the present invention will hereafter be described in conjunction with the appended drawing figures, wherein like designations denote like elements, and:

FIG. 4 is a cross-sectional illustration of a portion of an electrochemical deposition apparatus in accordance with an exemplary embodiment of the present invention;

FIG. 5 is a top-view illustration of a workpiece contacting surface in accordance with an embodiment of the present invention;

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE INVENTION

The following description is of exemplary embodiments only and is not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1:
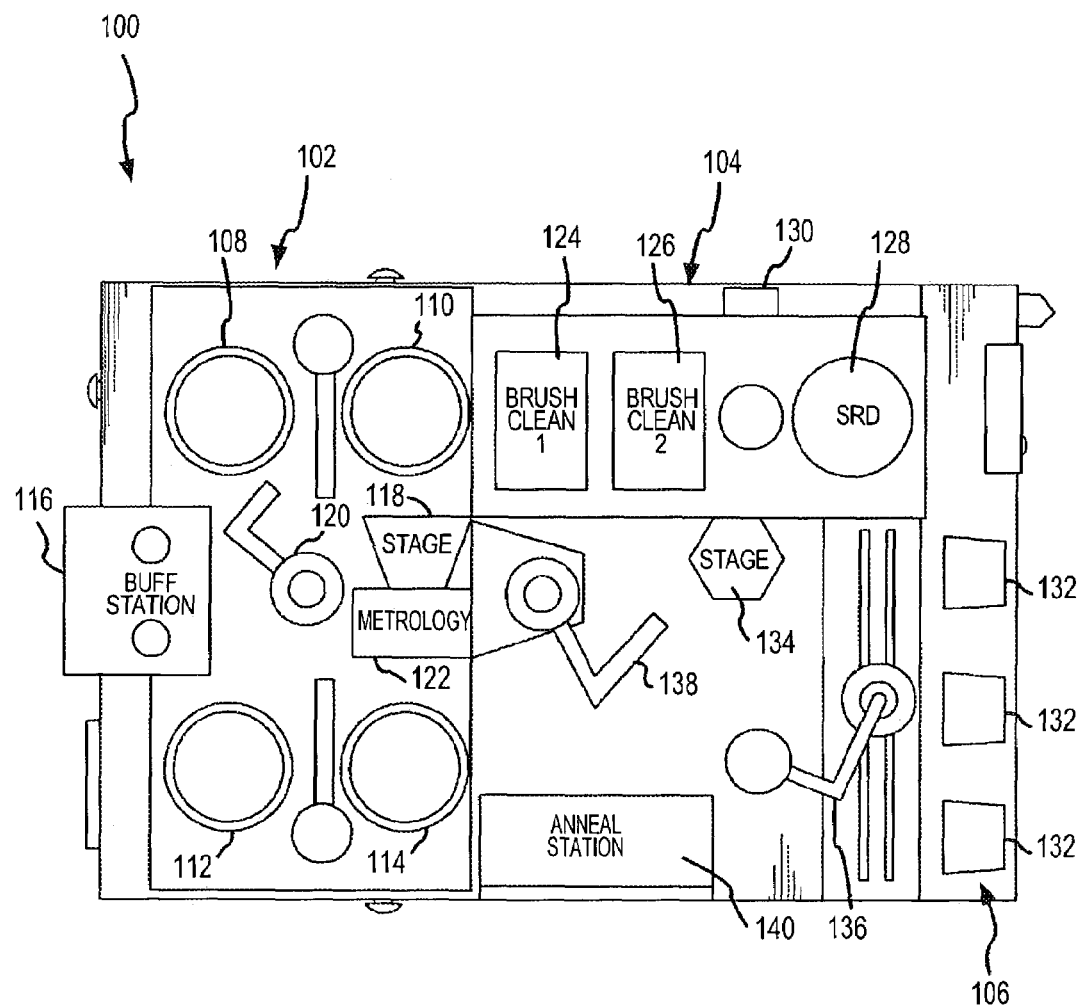
FIG. 1 is a top cut-away illustration of a multi-process workpiece apparatus in accordance with an exemplary embodiment of the present invention.

FIG. 1 illustrates a top cut-way view of a multi-process workpiece apparatus 100 suitable for electrochemically depositing conductive material onto a surface of a workpiece in accordance with the present invention. Apparatus 100 includes a multi-platen polishing system 102, a clean system 104, and a wafer load and unload station 106. Although the present invention may be used to deposit conductive material onto a variety of workpieces, the invention is conveniently described below in connection with depositing material onto a surface of a wafer. The term "wafer" shall mean semiconductor substrates, which may include layers of insulating, semiconducting, and conducting layers or features formed thereon, used to manufacture microelectronic devices.

Exemplary multi-process system 102 includes four processing stations 108, 110, 112, and 114, which each operate independently; a buff station 116; a stage 118; a transport robot 120; and optionally, a metrology station 122 and an anneal station 140. Processing stations 108–114 may be configured as desired to perform specific functions; however, in accordance with the present invention, at least one of processing stations 108–114 includes an electrochemical deposition apparatus as described herein. The remaining stations may be configured for electrochemical polishing, traditional chemical mechanical polishing, seed layer enhancement; wet etching and the like. Alternatively, any one of stations 108–114 may be used to perform more than one process, such as both seed layer enhancement and electro deposition, for example, as later described with reference to FIG. 12.

Clean station 104 is generally configured to remove debris such as slurry residue and material removed from the wafer surface during polishing. In accordance with the illustrated exemplary embodiment, station 104 includes brush cleaners 124 and 126, a spin rinse dryer 128, and a first robot 130. In an alternative embodiment of the present invention, not illustrated in FIG. 1, clean station 104 may include a carbon dioxide particle cleaner. Carbon dioxide particle cleaners are well known in the art and are configured to bombard wafers with carbon dioxide particles to remove foreign particulates from the wafer. Spin rinse dryer 128 may be configured for conventional spin rinsing and drying as is well known in the art; in another embodiment of the present invention, spin rinse dryer 128 may also be configured for bevel edge etching, as is also well known in the art.

Wafer load and unload station 106 is configured to receive dry wafers for processing in cassettes 132. In accordance with the present invention, the wafers are dry when loaded onto station 106 and are dry before return to station 106.

In accordance with an alternate embodiment of the invention, clean station 104 may be separate from the multi-process workpiece apparatus. In this case, load station 106 is configured to receive dry wafers for processing, but the wafers may remain in a wet state after plating or polishing and before transfer to a clean station.

In operation, cassettes 132, including one or more wafers, are loaded onto apparatus 100 at station 106. The wafers are then individually transported to a stage 134 using a second robot 136. A third robot 138 retrieves a wafer at stage 134 and transports the wafer to metrology station 122 for film characterization or to stage 118 within polishing system 102. Transport robot 120 picks up the wafer from metrology station 122 or stage 118 and transports the wafer to one of processing stations 108–114 for electrochemical deposition of a conductive material.

In another exemplary embodiment, the wafer may be transferred to one of processing stations 108–114 for seed layer enhancement before electrochemical deposition. Seed layer enhancement may be performed with an electric current or may be electroless, i.e. performed by chemical reduction in the absence of electric current. Seed layer enhancement is well known in the art. For example methods of seed layer enhancement, see U.S. Pat. No. 6,197,181 to Chen issued Mar. 6, 2001, U.S. Pat. No. 6,258,223 to Cheung et al. issued Jul. 10, 2001, and Publication No. WO 02/50336 A2 to Hsu et al. published Jun. 27, 2002, all of which are incorporated herein by reference. Alternatively, as later discussed with reference to FIG. 12, both seed layer enhancement and electrochemical deposition may be performed at a single station.

After transfer to one of processing stations 108–114 for electrochemical deposition and after a desired amount of material is deposited onto the wafer surface, a portion of the deposited material and, if desired, other materials may be removed by transporting the wafer to another processing station 108–114 for chemical mechanical planarization (CMP), electrochemical planarization (ECMP) or wet etching. Alternatively, as discussed below, a polishing environment within one of the stations may be changed from an environment suitable for electrochemical deposition to an environment suitable for electrochemical planarization— e.g., by changing the solution and the bias applied to the wafer, as discussed in more detail below. In this case, a single polishing station may be used for both deposition of material and removal of material. Accordingly, a single polishing station may be used to perform seed layer enhancement, electrochemical deposition and electrochemical planarization.

In a further exemplary embodiment of the invention, transport robot 120 may be configured with at least two end effectors (not shown), one end effector for transporting dirty wafers and one for transporting clean wafers. Because multi-process workpiece apparatus 100 may provide both electrochemical deposition stations and planarization stations, it is desirable to ensure the cleanliness of wafers before the wafers are subjected to deposition, as any particulates from slurry or by-products of planarization may adversely impact deposition. Accordingly, by way of example, transport robot 120 may receive a clean wafer from stage 118 using the clean end effector and may transport the wafer to one of processing stations 108–114 for electrochemical deposition. Using the same end effector, transport robot 120 may then transport the wafer to one of processing stations 108–114 for planarization, after which the dirty end effector of transport robot 120 may receive the wafer and transport it back to stage 118.

In an alternative embodiment of the present invention, multi-process system 102 may include a rinse station (not shown). The rinse station may be configured to clean the end effector of transport robot 120 or a wafer that it carries, or both the robot end effector and wafer simultaneously. The transport robot 120 may receive an unclean wafer from one of processing stations 108–114, access the rinse station and then transport the now clean wafer to another processing station 108–114, metrology station 122, buff station 116 or stage 118.

In accordance with another exemplary embodiment of the invention, after electrochemical deposition, the wafer may be transported by transport robot 120 from processing stations 108–114 to stage 118, where it is transported by third robot 138 to spin rinse dryer 128 for bevel edge etching, and/or rinsing and drying and then to anneal station 140 where the wafer may be annealed, as is well known in the art. A typical anneal process suitable for wafer processing using multi-process workpiece apparatus 100 may include heating the wafer to temperatures in the range of about 100–400° C. for about 15 seconds to 1 minute in an ambient gas of $N_2$, $H_2$ or forming gas, although it will be appreciated that any suitable annealing process may be used. Following annealing, third robot 138 may transport the wafer from anneal station 140 back to stage 118 where transport robot 120 receives it and transports it to one of processing stations 108–114 for chemical mechanical planarization, electrochemical planarization or wet etching.

After conductive material has been deposited onto the wafer surface via electrochemical deposition and a desired amount of the material has been removed via electrochemical planarization, CMP or wet etching, the wafer may be transferred to buff station 116 to further polish the surface of the wafer. After the polishing and/or buff process, the wafer may be transferred to stage 118. In accordance with one embodiment of the invention, stage 118 is configured to maintain one or more wafers in a wet, e.g., deionized water environment. The stage 118 is preferably configured with a plurality of slots or trays to hold several wafers at a time. The wet environment of stage 118 may be suitably maintained by providing spray nozzles for spraying the wafers with deionized water while in the slots. Alternatively, stage 118 could be configured in a bath type arrangement such that the slots and wafers are fully immersed in a bath of deionized water.

After a wafer is placed in stage 118, third robot 138 picks up the wafer and transports the wafer to clean system 104. In particular, third robot 138 transports the wafer to first robot 130, which in turn places the wafer in one of cleaners 124, 126. The wafer is cleaned using one or more cleaners 124, 126 and is then transported to spin rinse dryer 128 to rinse and dry the wafer prior to transporting the wafer to load/unload station 106 using robot 136.

Figure 2:
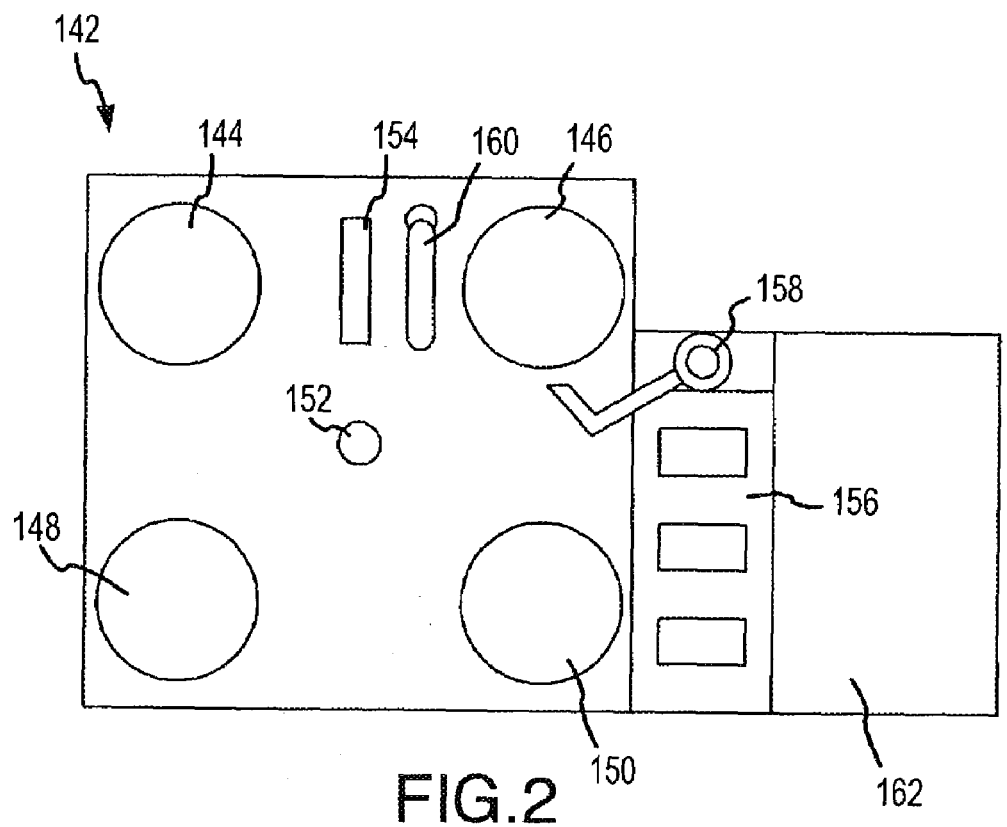
FIG. 2 is a top cut-away illustration of a portion of a multi-process workpiece apparatus in accordance with another embodiment of the present invention.
Figure 3:
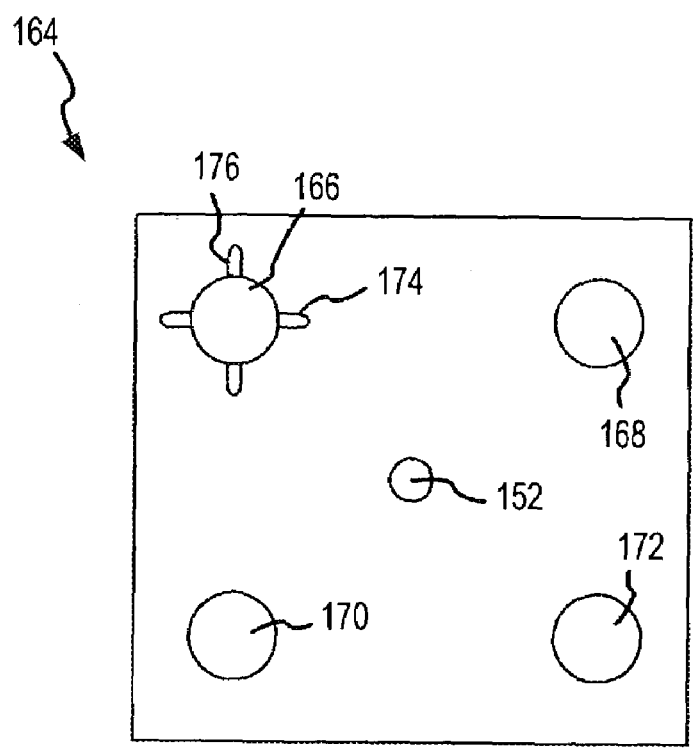
FIG. 3 is a bottom cut-away view of a carousel for use with the apparatus of FIG. 2.

FIG. 2 illustrates a top cut-away view of another exemplary multi-process workpiece apparatus 142 configured to electrochemically deposit material onto a wafer surface and remove a portion of the deposited material. Apparatus 142 is suitably coupled to carousel 164, illustrated in FIG. 3, to form an automated electrochemical polishing system. An electrochemical polishing system in accordance with this embodiment may also include a removable cover (not illustrated in the figures) overlying apparatus 142 and 164.

Apparatus 142 includes three processing stations 144, 146, and 148. At least one of stations 144–148 is configured for electrochemical deposition, as described below. The other polishing stations may be configured for seed layer enhancement, CMP, electrochemical planarization and/or wet etching. In addition, any one polishing station may be used to perform a number of processes such as, for example, electrochemical deposition and ECMP, or electroless seed layer enhancement, electrochemical deposition and eCMP.

Apparatus 142 may also include a wafer transfer station 150, a center rotational post 152, which is coupled to carousel 164, and which operatively engages carousel 164 to cause carousel 164 to rotate, a load and unload station 156, a robot 158 and an anneal station 162. Furthermore, apparatus 142 may include one or more rinse washing stations 154 to rinse and/or wash a surface of a wafer and/or an end effector of robot 158 before or after a polishing or electrodeposition process. Although illustrated with three processing stations, apparatus 142 may include any desired number of processing stations and one or more of such stations may be used to buff a surface of a wafer as described herein.

At least one of processing stations 144–148 may include a platen and a polishing surface attached thereto as described herein. In addition, at least one of processing stations 144–148 may include a pad conditioner 160 to condition the surface of the polishing surface.

Wafer transfer station 150 is generally configured to stage wafers before or between polishing and/or buff operations and may be further configured to wash and/or maintain the wafers in a wet environment.

Carousel apparatus 164 includes carriers 166, 168, 170, and 172, at least one of which is configured to hold a single wafer and urge the wafer against a polishing surface (e.g., a polishing surface associated with one of stations 144–148). Each carrier 166–172 is suitably spaced from post 152, such that each carrier aligns with a processing station 144–148 or transfer station 150. In accordance with one embodiment of the invention, each carrier 166–172 is attached to a rotatable drive mechanism using a gimbal system (not illustrated), which allows carriers 166–172 to cause a wafer to rotate (e.g., during a deposition process). In addition, the carriers may be attached to a carrier motor assembly that is configured to cause the carriers to translate radially—e.g., along tracks 174 and 176. In accordance with one aspect of this embodiment, each carrier 166–172 rotates and translates independently of the other carriers.

In operation, wafers are processed using apparatus 142 and 164 by loading a wafer onto station 150, from station 156, using robot 158. One of wafer carriers 166–172 is lowered over the wafer and a mechanism, such as a vacuum, is used so that the carrier may receive and engage the wafer. When a desired number of wafers are loaded onto the carriers, at least one of the wafers is placed in contact with an electrochemical deposition station in accordance with the present invention. After electrochemical deposition, the wafer may then be polished and/or buffed in accordance with various embodiments of the invention.

A schematic representation of an apparatus 200 for electrochemical deposition (e.g., a portion of one of processing stations 108–114 or processing stations 144–148) of the present invention is illustrated in FIG. 4. In accordance with one embodiment of the invention, apparatus 200 is configured to perform polishing or planarization in addition to electrochemical deposition to form conductive features on a surface of a wafer.

Apparatus 200 includes a wafer carrier assembly 202 and a platen assembly 226. Platen assembly 226 includes a wafer contacting surface 204 and a platen 206. In general, apparatus 200 is configured to electrochemically deposit material onto a surface of a wafer 260 coupled to assembly 202 via wafer holder 212. Electrochemical deposition results from applying a bias between wafer 260 and platen 206 in the presence of an electrolyte solution and placing wafer 260 in contact with or in close proximity to wafer contacting surface 204 and moving wafer 260 and wafer contacting surface 204 relative to each other. Apparatus 200 allows for the formation of conductive features such as copper plugs and lines, with reduced equipment requirements, reduces an amount of material that must be removed from the surface of the wafer after the deposition process, and may reduce an amount of leveling agents required in the electrolyte solution. Furthermore, because less or no leveling agents are required to form conductive features using the apparatus of the present invention, the conductive features may not require annealing or may require less annealing to adjust the grain structure of the deposited material.

To facilitate electrochemical deposition, platen 206, which serves as the anode during electrochemical deposition, includes a conductive material such as tantalum, gold, or platinum, which is relatively inert with respect to the electrolyte solution. Platen 206 may be formed entirely of the inert, conductive material, or alternatively, may be formed of a material such as copper or titanium. Platen 206 may also be formed of a two-piece arrangement combining a conductive material plate portion adjacent a metal or polymeric support portion. Platen 206 is suitably connected to a power source 214 which is configured to establish an electric potential difference between platen 206 and wafer 260, as described in more detail below.

Platen 206 is also generally configured to move relative to assembly 202 to facilitate uniform deposition of material onto a surface of wafer 260. Platen 206 may be connected to a driver or motor assembly (not shown) that is operative to rotate platen 206 and wafer contacting surface 204 about a vertical axis. It will be appreciated, however, that the driver or motor assembly may be operative to move platen 206 and wafer contacting surface 204 in an orbital, linear, rotational, or oscillatory pattern or any combination thereof. Alternatively, relative motion between assembly 202 and wafer contacting surface 204 may be obtained solely by moving assembly 202 with respect to a stationary platen 206.

In accordance with an exemplary embodiment of the invention, platen 206 includes one or two, but preferably a plurality of channels 216 for the transportation of an electrolyte solution to a wafer contacting surface 218 of wafer contacting surface 204 from a manifold apparatus (not shown) or any suitable fluid distribution system. Alternatively, it will be appreciated that the electrolyte solution may be deposited directly on or through surface 218 by a conduit or any suitable application mechanism.

In accordance with the present invention, an electric potential difference is effected between platen 206 and the surface of wafer 260 by applying a relatively negative potential to the surface of wafer 260 using electrical conductors 220, which are embedded within wafer contacting surface 204. Conductors 220 may be disposed in any arrangement within platen 206 and wafer contacting surface 204. For example, conductors 220 may be uniformly distributed, geometrically distributed, randomly distributed or may be distributed along the periphery of platen 206 and wafer contacting surface 204. Preferably, conductors 220 are arranged to maximize uniform deposition.

Conductors 220 are coupled to power source 214, which generates a bias between conductors 220 and platen 206, which is also coupled to power source 214. In particular, power source 214 applies a relative positive charge to platen 206, the anode, and applies a relative negative charge to electrical conductors 220, the cathodes. The relative negative charge is transmitted to the surface of wafer 260 using conductors 220, which are electrically isolated from platen 206. Positioning of the electrical conductors within the polishing surface facilitates creation of a uniform electric potential gradient across the surface of the wafer, reducing the likelihood that edge effects and the like may result. Furthermore, because the cathode electrodes are not attached directly to the surface of wafer 260, a greater amount of surface area of wafer 260 is available for device formation.

In an exemplary embodiment of the invention, the distance between the surface of wafer 260 and platen 206 may be less than 3 mm. Preferably, the distance is less than 1 mm and more preferably is less than 2000 angstroms. However, to avoid shorting of the circuit formed from platen 206 through the electrolyte solution to the wafer surface, the platen should not contact the surface of wafer 260.

In accordance with one exemplary embodiment of the invention, at least one electrical conductor 220 is positioned within platen 206. While FIG. 4 shows a plurality of electrical conductors 220 positioned within platen 206, it will be appreciated that one, two or any suitable number of electrical conductors 220 may be positioned within platen 206. Electrical conductors 220 are connected at a first end to power source 214 and are insulated from platen 206 by insulation elements 222. Each of the electrical conductors 220 may include at a second end a contact element 224. At least a portion of contact element 224 is positioned within wafer contacting surface 204. A top surface of contact element 224 may be positioned above or below top surface 218 of wafer contacting surface 204, but is preferably positioned flush with top surface 218 of wafer contacting surface 204. Contact element 224 may be formed of any suitable material that exhibits low electrical resistance, resistance to corrosion and deposition, and a material hardness that is less than the hardness of the material that comprises the surface of wafer 260. For example, if the surface of wafer 260 is formed of copper, contact element 224 may be formed of a conductively-enhanced polymer material, ceramic material or inorganic fibers such as, for example, carbon fibers.

The electrolyte solution may include suitable precursors to the material to be deposited onto the surface of wafer 260. In accordance with one exemplary embodiment of the invention, the electrolyte solution may include a copper plating solution. Such solutions are generally known in the art and typically include dissolved copper salts such as copper sulfate, leveling agents, suppressants, and accelerators.

Wafer contacting surface 204 is suitably formed of an insulating material such as a polymeric material, a polymetric/inorganic composite "fixed abrasive" material, or a ceramic insulator material as are used in chemical mechanical polishing of conductive films. Blown polyurethane pads, such as the IC and GS series of pads available from Rodel Products Corporation of Scottsdale, Ariz., may be advantageously used, with the added benefit of being capable of also polishing wafer 260 in a chemical mechanical polishing step, although it will be appreciated that any suitable polishing pad or surface may be used in accordance with the present invention.

In a preferred embodiment the wafer contacting surface 204 is formed from a material exhibiting a low coefficient of surface friction, and a relatively smooth surface finish. It has been found that a smooth, low friction surface can enhance the deposition process by minimizing mechanical abrasion of the metal film being formed on the wafer in situations where the surface plate 204 is in actual contact with the surface of the wafer. Preferably the surface 204 is formed from a material with a coefficient of surface friction of less than about 0.2, and more preferably between 0.06 and 0.1. The surface roughness is preferably less than about 100 micro-inches per inch, and more preferably between about 10 and 50 micro-inches per inch. One skilled in the art will recognize that the actual surface finish can be tailored within these ranges by lapping or polishing the surface 204 as required.

It is also desirable that surface 204 be formed of a material that is relatively volume incompressible under an applied pressure load. Volume compressibility can be defined in terms of the bulk modulus, or hydrostatic modulus of the material, and represents the change in volume which occurs in a material under hydrostatic loading, i.e. with pressure applied from all sides. The higher the compressibility of a material, the greater the volume change under an applied pressure load. Preferably the bulk modulus, or compressibility, of surface 204 is greater than about 50,000 pounds per square inch (psi) under an applied surface pressure of less than 4 psi, and greater than about 70,000 psi under an applied surface pressure of less than 2 psi. Suitable materials with the above properties include non-porous polymers such as for example molded Polytetrafluoroethylene (PTFE), available from DuPont under the tradename Teflon®. This material is also highly inert (i.e. chemically resistant), and its hardness is comparable to polyurethane polishing pads of the type referred to above typical for chemical-mechanical polishing of wafers. Other suitable materials from which surface 204 may be manufactured are polyether ether keytone, acetal homopolymer, polethylen terapthalate, polyphenyl sulfide, and polyvinyl chloride.

Wafer contacting surface 204 has a thickness which may range from approximately 200 angstroms to approximately 3 mm. However, the current density and, accordingly, the deposition rate of the of material onto a surface of wafer 260 is inversely proportional to the distance between platen 206, which acts as an anode when an electric potential is applied, and the surface of wafer 260, which acts as an cathode during material deposition.

Figure 6:
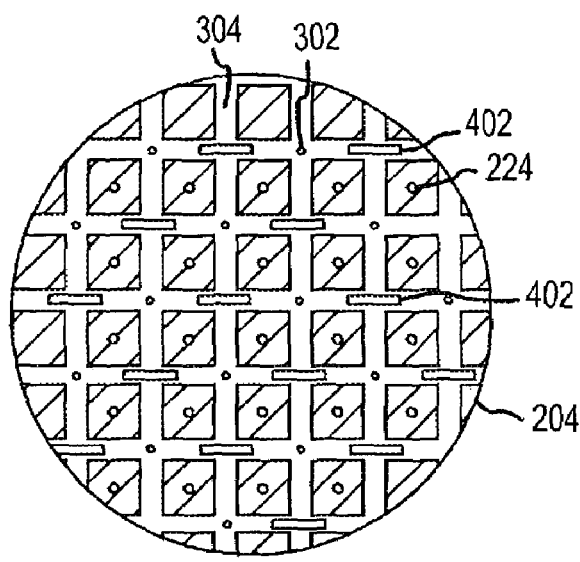
FIG. 6 is a top-view illustration of a workpiece contacting surface in accordance with another exemplary embodiment of the present invention.

FIG. 5 illustrates a top view of wafer contacting surface 204. As illustrated in both FIGS. 4 and 5, and in accordance with an exemplary embodiment of the invention, wafer contacting surface 204 includes apertures 302 through which the electrolyte may flow. In accordance with one aspect of this embodiment, apertures 302 are aligned with channels 216 formed within platen 206, such that electrolyte solution may circulate through platen 206 and onto wafer contacting surface 204. Because wafer contacting surface 204 is formed of insulating material, apertures 302 may also be configured to direct electric fields between platen 206 and wafer 260. In accordance with one aspect of this embodiment, wafer contacting surface 204 includes grooves 304. Grooves 304 are configured to effect transportation of the electrolyte solution on wafer contacting surface 204 during a polishing process. Wafer contacting surface 204 may also be porous, further facilitating transportation of the electrolyte solution. In an alternative embodiment, as illustrated in FIG. 6, wafer contacting surface 204 may have cut-out portions, or "windows" 402, preferably positioned within grooves 304, which expose portions of platen 206 to create desired electrical fields between platen 206 and the surface of wafer 260. It will be appreciated, however, that wafer contacting surface 204 may have any suitably-shaped openings that are configured to produce a uniform or other desired electric field at desired areas of the wafer.

Referring again to FIG. 4, the apparatus of the present invention may also include a temperature control mechanism 228. The temperature of the surface of wafer 260 during electrochemical deposition may have a significant effect on the uniformity of the deposited conductive film, the quality of the deposited film, and the rate of deposition of the film. If, for example, the temperature is too high in a given area, the deposition rate may increase in that area, causing non-uniform film deposition on the surface of wafer 260. To counteract the generation of localized hot spots, in one embodiment of the present invention, the electrolyte solution may be cooled before being delivered to the surface 218 of wafer contacting surface 204. In this embodiment, the electrolyte solution may be subjected to a chiller 230 before being delivered to surface 218.

In an alternative embodiment of the invention, the temperature of the electrochemical deposition process may be controlled by providing a heat exchange fluid to the backside of wafer 260. Apparatus for exposing a heat exchange fluid to the backside of a wafer are well known in the art. For an example of an apparatus configured to regulate the polishing rate of a wafer by backside heat exchange, see U.S. Pat. No. 5,605,488, issued to Ohashi et al. on Feb. 25, 1997, which patent is hereby incorporated by reference.

Figure 7:
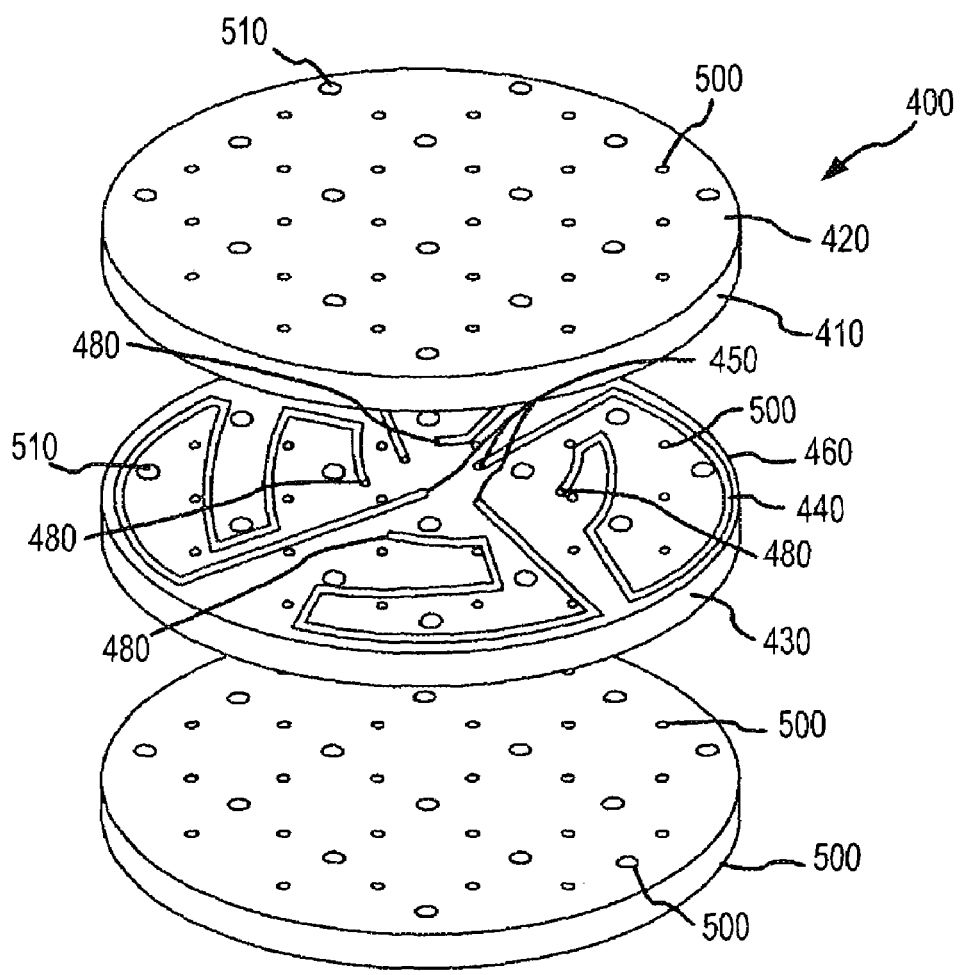
FIG. 7 is an exploded-perspective illustration of a platen including a heat exchanger in accordance with another exemplary embodiment of the present invention.

The temperature of the electrochemical deposition process may also be regulated by providing a heat conductive platen configured to be temperature controlled by a heat exchange fluid circulating therethrough. Although there are a number of methods to fabricate such a platen, only one of those methods is illustrated herein. Referring to FIG. 7, in accordance with one embodiment of the invention, a platen 400 is fabricated from a material having a high thermal conduction coefficient to facilitate control of the processing temperature. Platen 400 may be constructed in three pieces that are connected together by belts, rivets or, preferably, by brazing to form a unitary platen. Platen 400, in this embodiment, is formed from a substantially circular cover plate 410 that has a substantially planar upper surface 420 to which a polishing surface such as a pad can be attached, for example, with an adhesive. In this embodiment, platen 400 further includes a channel section 430 that includes channel grooves 440. Preferably, channel grooves 440 are configured in a serpentine pattern. A heat exchange fluid flows from inlets 450 near the center or axis of platen 400 to a location near the periphery 460 of the platen and then, in a serpentine pattern to exits 480 again located near the center or axis of platen 400. Platen 400 is completed by a bottom section 490 that includes on its bottom surface (not shown) a configuration for the attachment of the platen to a platen shaft.

In an alternative method (not illustrated) for fabricating platen 400, the channel groove is formed in the underside of the cover plate. The channel groove may be sealed by attaching a circular disk having a planar top surface to the underside of the cover plate. The bottom section is attached to the circular disk, or, alternatively, the junction of the circular disk and the bottom section could be combined. In either this method or the illustrated method, a channel groove through which a heat exchange fluid can be circulated is formed beneath the substantially planar surface of the platen assembly.

Cover plate 410, channel section 430, and bottom section 490 each have a first set of channels 500, similar to channels 216 as referenced in FIG. 4, through which an electrolyte solution may flow. Channels 500 in cover plate 410 are colinear with channels 500 in channel section 430, which in turn are colinear with channels 500 in bottom section 490. A manifold apparatus (not shown) may be connected to bottom section 490 to deliver the electrolyte solution through channels 500 of the bottom section, the channel section, and the cover plate to the polishing pad.

In addition to channels 500, cover plate 410, channel section 430, and bottom section 490 may suitably include bores 510. Bores 510 in cover plate 410 are colinear with bores 510 in channel section 430, which in turn are colinear with bores 510 in bottom section 490. When the cover plate, channel section, and bottom section are connected together to form unitary platen 400, electrical conductors 200 may be seated within bores 510.

A method for electrochemically depositing material onto a surface of wafer 260 will now be described. Referring again to FIG. 4, wafer carrier assembly 202 urges wafer 260 against wafer contacting surface 204 such that wafer 260 engages wafer contacting surface 204 at a desired pressure. Preferably, the wafer carrier assembly 202 applies a uniform and constant pressure of approximately 2 psi or less, although it may be appreciated that any suitable pressure which promotes substantially uniform electrochemical deposition may be used.

During the electrochemical deposition process, an electrolyte solution is delivered to the surface of wafer contacting surface 204 through channels 216 and apertures 302. An electric potential is also applied to create a circuit between platen 206 and the surface of wafer 260. Power source 214 may be configured to apply a constant current or voltage to the apparatus or, alternatively, the current or voltage could be modulated to apply different currents or voltages at predetermined times in the process or to modulate between a predetermined current or voltage and no current or no voltage.

Wafer carrier assembly 202 and wafer 260 may rotate about an axis 232 while platen 206 and wafer contacting surface 204 move in a rotational, orbital, or linear pattern. In addition, wafer carrier assembly 202 and wafer 260 may oscillate relative to wafer contacting surface 204. Adjusting the various conditions of the electrochemical deposition process, such as the electric potential, distance between the electric conductors and the wafer surface, conductivity of the electrolyte solution, temperature, hydrodynamic conditions, and the like, permits suitable control over the uniformity and rate of deposition of conduction material onto the wafer surface.

Figure 8:
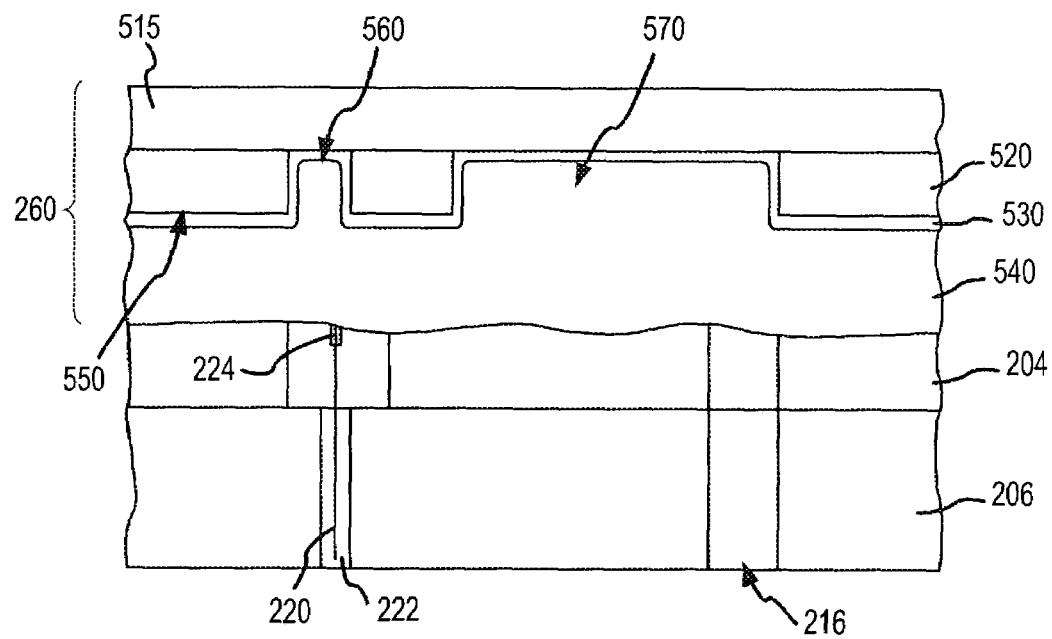
FIG. 8 is a cross-sectional illustration of a workpiece and a workpiece contacting surface during a material deposition process in accordance with the present invention.

FIG. 8 illustrates semiconductor wafer undergoing electrochemical deposition and polish using the apparatus and method of the present invention. In accordance with the illustrative example, wafer 260 includes a semiconductor substrate 515, an insulating layer 520 overlying the substrate and formed of, for example, low dielectric constant material, oxide, nitride, or a combination of such materials, underlying a seed layer of material and optionally a barrier layer 530. During the electrochemical deposition process, conductive ions in the electrolyte solution are attracted to the relative negative potential of wafer 260 and are reduced at the surface of the wafer to form, for example, a metallic film 540 (e.g., copper). As film 540 forms, material is plated into features 560 and 570 and also onto field regions (e.g., region 550) of the wafer surface, although more slowly due to the inhibiting influence of wafer contacting surface 204 thereby enabling planar plating which aids in producing workpieces with planar surfaces. As a result, the method and apparatus of the present invention function to minimize overburden, namely the thickness between the top of region 550 to the top of film 540, thereby requiring less work to be performed with CMP.

The method and apparatus of the present invention also function to enable planar plating, i.e. the creation of a flat upper surface of film 540, which also results in reducing the amount of work that needs to be performed with CMP. The method and apparatus of the present invention minimizes the overburden to a range that is preferably within about 1000 to 5000 Angstroms. Minimizing the overburden with the present invention is particularly critical in depositing a film over layers comprising low dielectric constant materials.

During the polishing and deposition process, electrolyte solution is circulated through platen 206 and wafer contacting surface 204 to provide a constant source of ions to the surface of the wafer. As the solution circulates, the solution flows through channels 216 and is distributed across the surface of the wafer.

Figure 9:
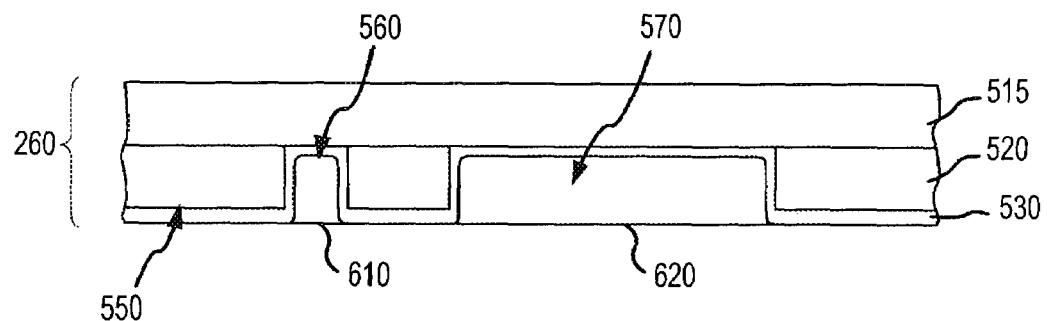
FIG. 9 is a cross-sectional illustration of a workpiece having embedded features formed within an insulating layer using the method of the present invention.

FIG. 9 illustrates wafer 260 after a portion of layer 540 has been removed, and before the barrier material has been removed. Material 540 may be removed by standard etching processes, such as wet etch, vapor etch, spray etch, plasma or even electrochemical planarization or chemical mechanical polishing, to form conductive features 610 and 620 within insulating material 520. In accordance with one exemplary embodiment of the invention, the excess material on the surface of wafer 260 is removed using chemical mechanical polishing or electrochemical mechanical polishing, e.g., using one of stations 108–114 illustrated in FIG. 1. The excess material may be removed in the station used to deposit material, or the material may be removed using a separate, dedicated polishing station. In accordance with one embodiment of the invention, a portion of material 540 is removed using electrochemical polishing techniques and a portion of barrier material 530 is removed, using a separate polishing station, from surface 550 using chemical mechanical polishing techniques.

Figure 10:
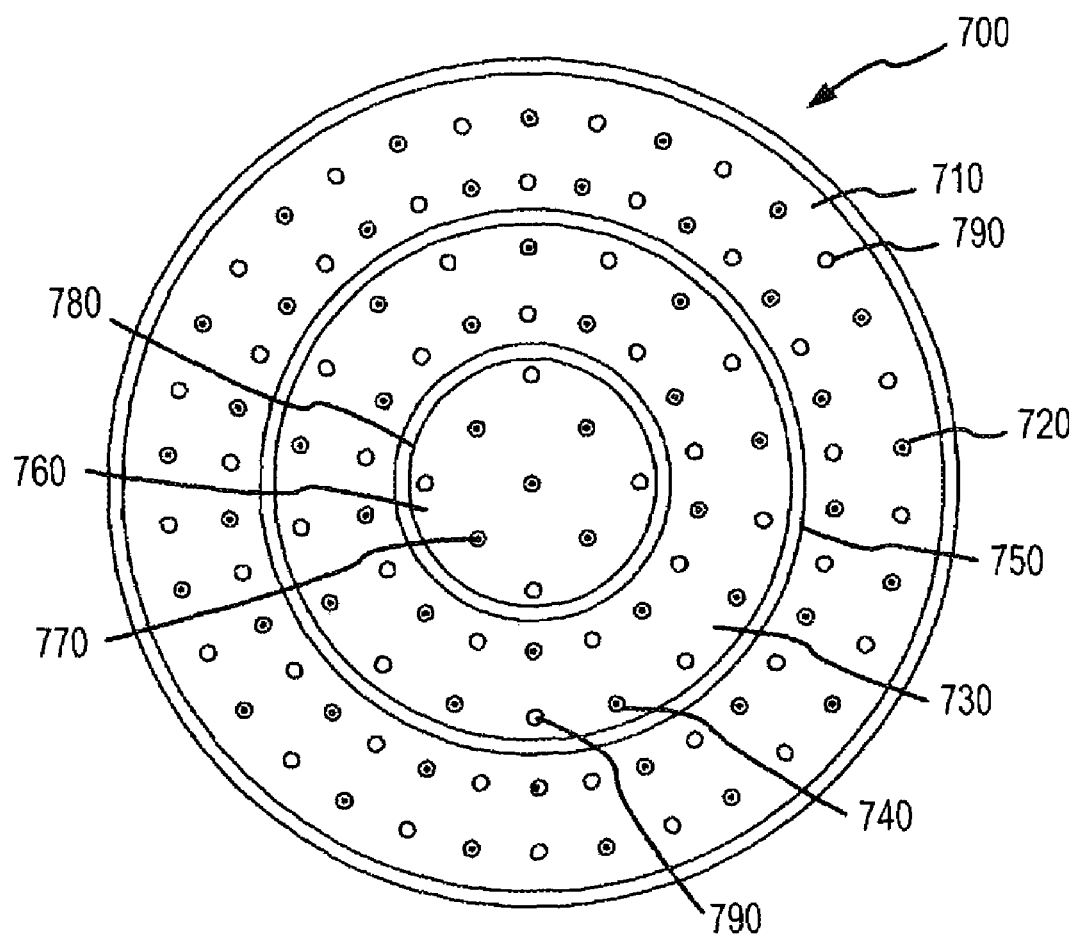
FIG. 10 is a top-view illustration of a platen in accordance with an embodiment of the present invention.

FIG. 10 illustrates another alternative embodiment of a platen of the present invention in which a platen 700 includes "zones" of electrical conductors to which different currents and/or voltages are supplied. Because the center of a wafer carrier (e.g., assembly 202) rotates at a lower velocity at its center than at its periphery, a wafer carried by the wafer carrier may exhibit a different deposition rate of material at the periphery of the wafer compared to the center of the wafer. To counteract this non-uniform deposition across the surface of the wafer, use of "zones" of electrical conductors supplied with different currents may be used. For example, in a first zone 710 one or more electrical conductors 720 may be connected to a first power supply which supplies a first current. In a second zone 730 one or more electrical conductors 740 may be connected to a second power supply which supplies a second current which is different from the first current. The first zone and the second zone may be separated by a first insulator 750. In addition, platen 700 may have a third zone 760 which has one or more electrical conductors 770 connected to a third power supply which supplies a third current, which may be equivalent to the first current or may be different from both the first and the second currents. The third zone may be separated from the second zone by a second insulator 780. While FIG. 10 shows three zones of electrical conductors to which two or more currents are supplied, it will be appreciated that platen 700 may have four or more zones with electrical conductors to which are supplied any suitable currents. Moreover, it will be understood by those skilled in the art that power may be supplied to the conductors in the various zones by a single power supply with different controllable resistors for various zones or by separate power sources for each of the zones. Platen 700 may further have channels 790 through which an electrolyte solution is supplied. Using this embodiment, the electric potential supplied to different areas of a wafer may be used to reduce edge effects which result when material is deposited at the peripheral edges of the wafer at a different rate than the material is deposited at the center of the wafer.

In another embodiment (not illustrated), the present invention may be configured for endpoint detection. Referring again to FIG. 8, as the material 540 is deposited onto substrate 515, the resistance of layer 540 decreases, thereby decreasing the voltage through the layer. This change in the electrical resistance across the layer may be monitored to determine the desired endpoint of the deposition process.

Figure 11:
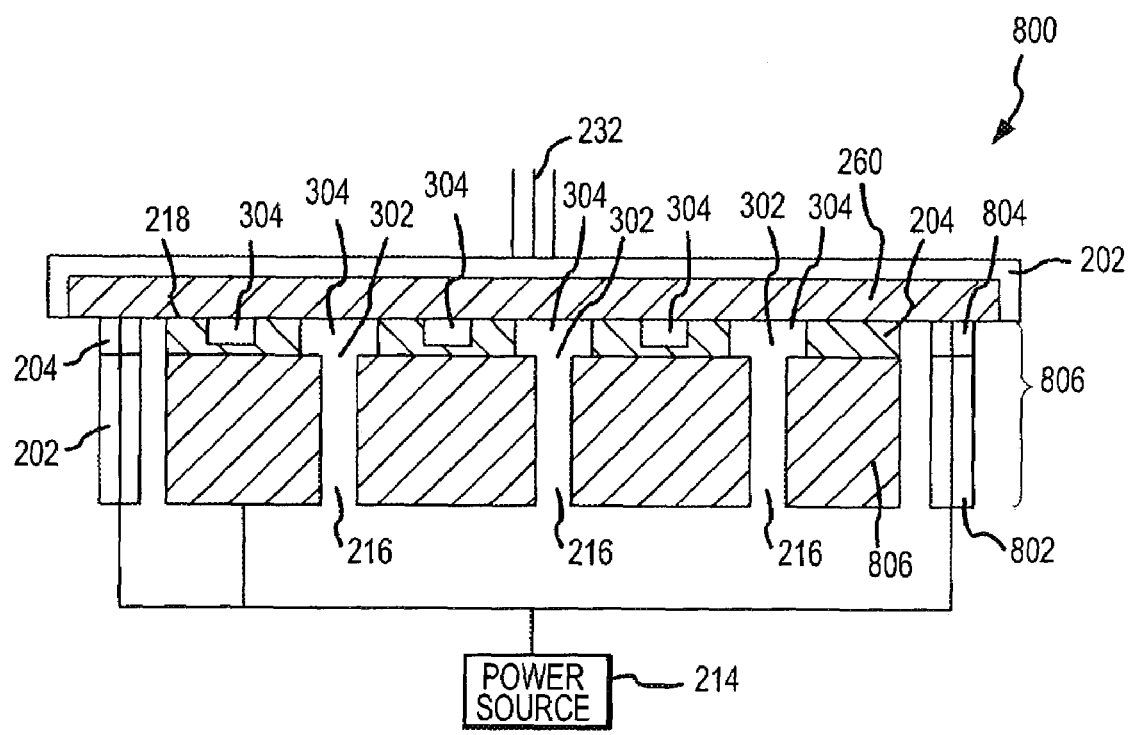
FIG. 11 is a cross-sectional illustration of a portion of an electrochemical deposition apparatus in accordance with another exemplary embodiment of the present invention.

FIG. 11 illustrates another exemplary embodiment of an electrochemical deposition apparatus of the present invention. Apparatus 800 is illustrated in FIG. 11, where elements similar to those illustrated in FIG. 4 with reference to apparatus 200 are designated with like reference numbers. Apparatus 800 includes wafer carrier assembly 202 and a platen assembly 806. In general, similar to apparatus 200 illustrated in FIG. 4, apparatus 800 is configured to electrochemically deposit material onto a surface of wafer 260 coupled to assembly 202 via wafer holder 212.

In accordance with an exemplary embodiment of the invention, platen assembly 806 includes wafer contacting surface 204 and platen 206. Platen 206 includes one or two, but preferably a plurality of channels 216 for the transportation of an electrolyte solution to surface 218 of wafer contacting surface 204 from a manifold apparatus (not shown) or any suitable fluid distribution system. Alternatively, it will be appreciated that the electrolyte solution may be deposited directly on or through surface 218 by a conduit or any suitable application mechanism.

In accordance with the present invention, platen assembly 206 also includes electrical conductors 802. An electric potential difference is effected between platen 206 and the surface of wafer 206 by applying a relatively negative potential to the surface of wafer 260 using electrical conductors 802. Electrical conductors 802 are disposed proximate the periphery of wafer contacting surface 204 but are not disposed in the wafer contacting surface 204 thereby enabling a wafer, while either rotating or stationary, to maintain a position over the edge of conductors 802. Conductors 802, which are separate from wafer contacting surface 204 and fixed to the frame of the tool, are coupled to power source 214, which generates a bias between conductors 802 and platen 206, which is also coupled to power source 214. In particular, power source 214 applies a relative positive charge to platen 206, the anode, and applies a relative negative charge to electrical conductors 802, the cathodes. The relative negative charge is transmitted to the surface of the wafer using conductors 220, which are electrically isolated from platen 206.

Each of the electrical conductors 802 are connected at a first end to power source 214 and may include at a second end a contact element 804. A top surface of contact element 804 may be positioned above or below top surface 218 of wafer contacting surface 204, but preferably is positioned flush with top surface 218 of wafer contacting surface 204. Contact element 804 may be formed of any suitable material that exhibits low electrical resistance, resistance to corrosion and deposition, and a material hardness that is less than the hardness of the material that comprises the surface of wafer 260.

Apparatus 800 may further utilize a chiller, such as chiller 230, and a temperature control mechanism, such as temperature control mechanism 228, described above with reference to FIG. 4. Apparatus 800 may also utilize a heat exchange fluid or may utilize a heat conductive platen, such as platen 400, described with reference to FIG. 7.

Figure 12:
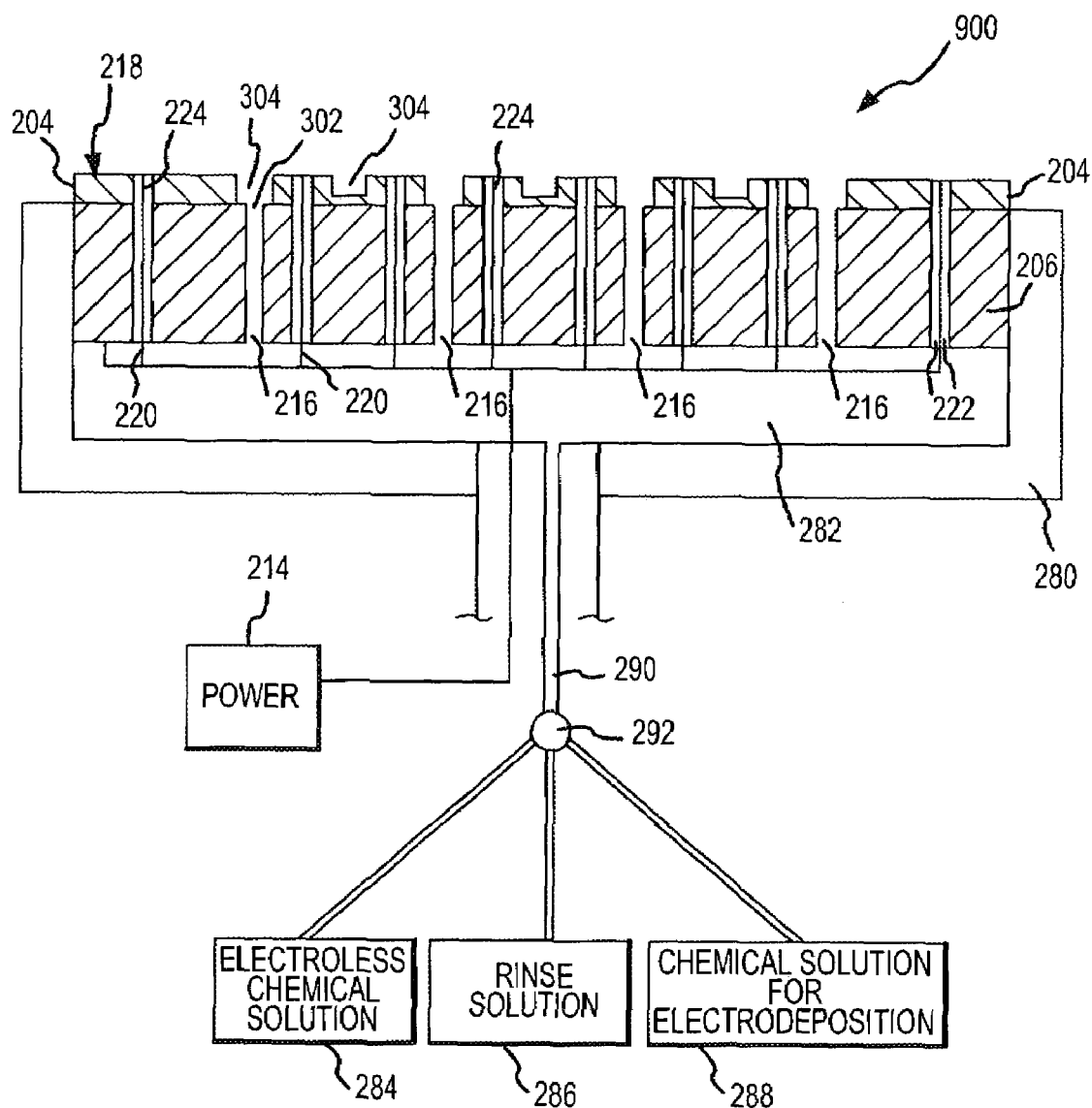
FIG. 12 is a cross-sectional illustration of a station for performing more than one process in accordance with an exemplary embodiment of the present invention.

FIG. 12 illustrates a cross-sectional view of an exemplary embodiment of a single station capable of performing both seed layer enhancement and electrochemical deposition in accordance with the present invention. Platen assembly 900 shown in FIG. 12 includes elements similar to those illustrated in FIG. 4 with reference to platen assembly 226 which are designated with like reference numbers. Platen assembly 900 includes wafer contacting surface 204, platen 206, platen holder 280, and plenum 282 located between a bottom of platen 206 and a top of platen holder 280.

Platen 206 includes one or more channels 216 for transportation of various solutions to wafer contacting surface 218 of wafer contacting surface 204. Plenum 282 functions to retain various solutions that are directed through channels 216 during various processes such as seed layer enhancement, electrochemical deposition, and eCMP.

FIG. 12 illustrates an exemplary embodiment of a single station having a platen that is capable of performing both seed layer enhancement, or electroless seed layer repair, and electrochemical deposition. Conduit system 290 serves to transport various solutions used during both processes to plenum 282. Reservoirs 284, 286, and 288 for supplying electroless chemical solution, rinse solution, and chemical solution for electrochemical deposition, respectively, are connected to conduit system 290 and their introduction into plenum 282 is controlled by valve 292.

In operation, platen assembly 900 may first be used for seed layer enhancement by introducing an electroless chemical solution from reservoir 284 into plenum 282 and in turn through channels 216 in platen 206. A wafer in a wafer carrier (not shown) is then brought into contact with the electroless chemical solution that has been supplied through channels 216. The wafer does not contact platen 206 during electroless seed enhancement and is instead bathed in the electroless chemical solution. Accordingly, there is preferably a gap of about 1 to 2 mm between the wafer and wafer contacting surface 204 of platen 206. Further, a dam or barrier (not shown) may be present as part of platen assembly 900 to aid in maintaining electroless chemical solution in the preferred gap thereby providing an electroless chemical solution bath for the wafer. Further, the wafer surface may contact cathodes 220, but not platen 206, to aid in seed layer repair or to carry out an initial non-plate contact step in the plating operation.

After seed layer enhancement with electroless chemical solution in reservoir 284, the wafer and platen assembly 900 may be flushed with rinse solution from reservoir 286 which is directed into plenum 282 and through channels 216 in the same way as the electroless chemical solution from reservoir 284. Flushing with the rinse solution may take place without lifting the wafer or, aternatively, the wafer may be lifted, the rinse solution flushed through channels 216, and the wafer then lowered with the continual flushing of rinse solution through channels 216.

After flushing, a chemical solution for electrodeposition from reservoir 228 may be directed into plenum 282 and through channels 216 in the same way as the electroless chemical solution from reservoir 284 and the rinse solution from reservoir 286. Electrochemical deposition can then be performed by applying power source 214 to platen 206, which functions as an anode, and to electrical conductors 220, which function as cathodes, in the same manner as previously described with reference to FIG. 4.

Referring again to FIG. 1, in addition to an electrochemical deposition apparatus, stations 108–114 may comprise an electrochemical planarization apparatus. An apparatus similar to apparatus 200 illustrated in FIG. 4 for electrochemical deposition, or apparatus 900 illustrated in FIG. 12 for both seed layer enhancement and electrochemical deposition, may be used for the electrochemical planarization of a workpiece having a metallized surface by reversing the polarity of power source 214 and by supplying a suitable electrolytic planarizing solution through channels 216 to surface 218 of wafer contacting surface 204.

Electrolytic planarizing solutions containing electrolytes suitable for use in the electrochemical planarization apparatus of the present invention are well known in the art. The electrolytic planarizing solution may include concentrated mineral acids such as phosphoric acid, sulfuric acid, chromic acid, perchloric acid, or mixtures thereof. Metaphosphoric acid, pyrophosphoric acid, polyphosphoric acid, and ammonium phosphate may also be used. Salts may be used in addition to or in place of acids in the solution, such as alkali and alkali earth metal salts of halides, carboxylates, and nitrates. Transition metal salts such as copper sulfate, copper nitrate and the like may also be included. In addition to these compounds, the electrolytic planarizing solution may also include a conventional CMP slurry to facilitate chemical mechanical planarization.

The electrolytic planarizing solution may also include a film forming agent which includes any compound or mixture of compounds that facilitates the formation of a passivation film of metal oxides and dissolution-inhibiting layers on the metallized surface of wafer 260. The passivation film reduces, and preferably eliminates, wet etching of low topography areas of the metallized surface of wafer 260 until the low topography areas come in contact with wafer contacting surface 204. When these low topography areas come in contact with wafer contacting surface 204 and electrical conductors 220, the passivation film is removed and electrochemical etching may proceed. Thus, the passivation film enhances uniform planarization of wafer 260. Suitable film forming agents may be formed of nitrogen-containing cyclic compounds such as proline, adedine, mercaptonitriles, imidazole, triazole, quinaldic acid, benzotriazole, benzimidazole and benzothiazole and their derivatives with hydroxy, amino, imino, carboxy, mercapto, nitro and alkyl substituted groups, as well as urea, thiourea and others.

Other suitable film forming agents may include benzofuroxan, benzothiadiazole, phenylenediamine, catechol, aminophenol, mercaptobenzothiazole, mercaptobenzotriazole, mercaptobenoxazole, melamine and thiadiazole.

The electrolytic planarizing solution may also include oxidizers to facilitate planarization. Oxidizers may be used in the electrolytic planarizing solution to tailor the oxidation-reduction potential of the solution for a desired application. Oxidizers may also be used to control the electric current density and to reduce the formation of bubbles which may cause non-uniform electropolishing. Suitable oxidizers may include hydrogen peroxide, ferricyanide, bisulfate, monopersulfate, periodate, perchlorate, and other "per" compounds and anions, nitrate, hypochorite, hydroxylamine (HDA) and hydroxylamine derivatives, including chloride, sulfate, nitrate and other salt derivatives.

Complexing agents also may be used in the electrolytic planarization solution. During the planarization of a metal layer, organic and metal ions and metal oxide may rapidly form on the etched metal layer, repassivating the metal layer. As described in more detail below, the wafer 260 may be urged against the wafer contacting surface 204 with a relatively low force, preferably no more than 1 psi. This low force may not be sufficient to remove a repassivation layer that forms so that electrochemical planarization may proceed. Complexing agents may be used to achieve acceptable planarization rates by inhibiting the formation of undesirable repassivation layers. Complexing agents also may prevent viscous gels formed of metal ion-saturated electrolytic planarizing solution from collecting on the wafer and the electrical conductors.

Suitable complexing agents include amines or compounds possessing amine-like characteristics. In one embodiment of the invention in which the metallized layer is formed of copper, the complexing agent may include glycine. Glycine forms a chelate complex with copper ions that inhibits the formation of copper oxide repassivation films. Other suitable complexing agents may include ethylenediaminetetraacetic acid and salts thereof, ethylene diamine, 1,8-diazabicyclo[5.4.0]undec-7-ene, 1,4-diazabicyclo[2.2.2]octane, ethylene glycol, crown ethers, catechol and gallol. Other useful complexing agents may be formed of acids, such as citric, lactic, malonic, tartaric, succinic, malic, acetic and oxalic acid, as well as amino acids, sulfamic and amino sulfuric acids, phosphoric acids, phosphonic acids, 2-quinoline carboxylic acid, and their salts. Fluoride and fluoride-containing compounds that are capable of producing active fluoride, such as fluoboric acid, fluotitanic acid, hydrofluoric acid, fluosilicic acid and the like, and their salts, may also be used.

Additives which modify and control the viscosity of the electrolytic planarizing solution may also be included. Such additives may optimize viscosity to reduce turbulent flow of the electrolytic planarizing solution which may result in non-uniform electrochemical etching. Such additives may include glycerol, glycerin, alcohols, such as methanol, ethanol, propanol and the like, and ester and ether solvents, such as ethylene glycol monobutylether. Polymeric additives such as polyacrylic acid, propylene oxide, polyethylene oxide and polyvinylalcohol may also be used if they are soluble in the highly ionic electrolytic planarizing solution.

Surfactants may also be a useful component of the electrolytic planarizing solution. Surfactants may be used to facilitate wetting of the metal layer, the passivation film formed by the film forming agent, and the electrical conductors to prevent bubbles from adhering to those surfaces.

To effect electrochemical planarization, an electric potential difference is produced between platen 206 and wafer 260 via electrical conductors 220. Power source 214 applies a negative charge to platen 206 and applies a positive charge to electrical conductors 220. The positive charge is conducted through electrical conductors 220, through contact elements 224 and the electrolytic planarizing solution, and then to the metallized surface of wafer 260. Again, positioning of the electrical conductors within the platen facilitates creation of a uniform electric potential gradient across the surface of the wafer, reducing the likelihood that edge effects and the like may result. In one exemplary embodiment of the invention, the distance between the metallized surface of the wafer 260 and the platen 206 is less than 3 mm. Preferably, the distance between the metallized surface of the wafer 260 and the platen 206 is less than 1 mm and is more preferably less than 2000 angstroms. However, to avoid shorting of the circuit formed from platen 206 through the electrolytic planarizing solution to the metallized surface of the wafer 260, the platen 206 should not contact the metallized surface of the wafer.

The electrochemical planarization apparatus may also include a temperature control mechanism. The temperature of the metallized surface of wafer 260 during electrochemical planarization may have a significant effect on the uniformity of the metal removal rate. If the temperature is too high in a given area, electric current may concentrate in that area, causing localized hot spots where metal ion dissolution is occurring at a faster rate than surrounding low-temperature areas. To counteract generation of localized hot spots, in one embodiment of the present invention the electrolytic planarizing solution may be cooled before being delivered to the surface 218 of wafer contacting surface 204. In this embodiment, the electrolytic planarizing solution may be subjected to the chiller 230 before being delivered to platen 206.

In an alternative embodiment of the invention, the temperature of the electrochemical planarization process may be controlled by providing a heat exchange fluid to the backside of wafer 260, as described above.

In another embodiment of the invention, the temperature of the electrochemical planarization process may also be regulated by providing a heat conductivity platen configured to be temperature controlled by a heat exchange fluid circulating therethrough, as discussed above with reference to platen 400 of FIG. 7.

Referring to FIG. 4, in operation apparatus 200 may be used for electrochemical planarization by causing wafer carrier assembly 202 to urge wafer 260 against wafer contacting surface 204 at a desired pressure. Preferably, the wafer carrier applies a uniform and constant pressure of approximately 1 psi or less, although it may be appreciated that any suitable pressure which promotes planarization without interfering with the concurrent electrochemical etching process may be used. Alternatively, to further control the rate of metal removal, the wafer carrier may press the wafer against the polishing pad for a predetermined amount of time, subsequently withdraw the wafer from the polishing surface for a predetermined amount of time, and then repeat the pressing/withdrawing pattern a desired number of times. For example, the wafer carrier assembly may "bump" the wafer against the polishing pad for a predetermined number of times to control the removal rate of the metallized surface.

During the planarization process, an electrolytic planarizing solution is delivered to the surface 218 of wafer contacting surface 204 through channels 216 and apertures 302. An electric potential is also applied to create a circuit between platen 206, the electrolytic planarizing solution and the metallized surface of wafer 260. The power source 214 may apply a constant current or voltage to the apparatus or, alternatively, the current or voltage could be modulated to apply different currents or voltages at predetermined times in the process or to modulate between a predetermined current or voltage and no current or no voltage. Wafer carrier 202 and wafer 260 may rotate about an axis 232 while platen 206 and wafer contacting surface 204 move in a rotational, orbital or linear pattern. In addition, wafer carrier 202 and wafer 260 may oscillate relative to polishing pad 204. Adjusting the various conditions of the electrochemical planarization process, such as the electric potential, distance between the electric conductors and the metallized surface, conductivity of the electrolytic planarizing solution, temperature, hydrodynamic conditions, and mechanical integrity of the passivation film, permits suitable control over the uniformity and rate of removal of metal from the metallized surface.

After planarization is completed, any remaining metal from the metallized surface and any remaining barrier layer may be removed by standard etching processes, such as wet etch, vapor etch, spray etch, plasma, buffing or even CMP, since the surface of the wafer had just previously been substantially planarized with electrochemical planarization. Alternatively, a second electrochemical planarizing solution may be supplied through channels 216 and apertures 302 to the wafer contacting surface 204. The second electrochemical planarizing solution may have a different composition, for example, different electrolytes, from the first electrochemical planarizing solution so that the second solution is more suitable for electrochemical etching of another metal layer, such as a barrier layer.

In another embodiment (not shown) of the invention, the electrochemical planarization apparatus described above may be configured for endpoint detection. Referring again to FIG. 4, as the metallized surface of wafer 260 is removed during the planarization process, the resistance of the metallized surface increases thereby increasing the voltage through wafer 260. This change in the electrical resistance across the metallized surface may be monitored to determine the desired endpoint in the planarization process.

In the foregoing specification, the invention has been described with reference to specific embodiments. However, it may be appreciated that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be constructed as critical, required, or essential features or elements of any or all of the claims. As used herein, the terms "comprises," "comprising" or any other variation thereof, are intended to cover a non-exclusive inclusion, such that a process, method, article, or apparatus that comprises a list of elements does not include only those elements but may include other elements not expressly listed or inherent to such process, method, article or apparatus.

We claim:

1. A multi-process workpiece apparatus comprising:
   an electrochemical deposition apparatus comprising a workpiece contacting surface formed of an electrically insulating material, said workpiece contacting surface having an exposed surface for contacting a metal-coated surface of a workpiece;
   a planarization apparatus; and
   a first transporter configured to transport a workpiece to said electrochemical deposition apparatus without introducing contaminants to said workpiece.

2. The multi-process workpiece apparatus of claim 1 further comprising a second transporter configured to transport a workpiece from said electrochemical deposition apparatus to said planarization apparatus following a deposition process without contaminating said planarization apparatus with a residue from said deposition process.

3. The multi-process workpiece apparatus of claim 2, wherein each of said first and second transporter comprises a robot having a first and a second end effector, said first end effector configured to handle only clean workpieces.

4. The multi-process workpiece apparatus of claim 2, wherein said first transporter is a first end effector of a robot and said second transporter is a second end effector of said robot.

5. The multi-process workpiece apparatus of claim 2, wherein at least one of said first transporter and said second transporter comprise a workpiece carrier.

6. The multi-process workpiece apparatus of claim 2, further comprising a workpiece rinsing station accessible by at least one of said first and second transporter.

7. A multi-process workpiece apparatus for processing a workpieee, said multi-process workpiece apparatus comprising:
   a seed layer enhancement apparatus;
   an electrochemical deposition apparatus having a platen assembly, said platen assembly comprising a platen, a workpiece contacting surface disposed proximate to said platen, and at least one electrical conductor disposed proximate to said workpiece contacting surface;
   a planarization apparatus; and
   at least one of a workpiece handling robot and a workpiece carrier configured to transport a workpiece from said electrochemical deposition apparatus to said planarization apparatus.

8. The multi-process workpiece apparatus of claim 7 wherein the electrochemical deposition apparatus and the seed layer enhancement apparatus are a same piece of apparatus.

9. The multi-process workpiece apparatus of claim 7, wherein said electrochemical deposition apparatus is configured to monitor a change in an electrical resistance across a workpiece as material is deposited thereon during electrochemical deposition.

10. The multi-process workpiece apparatus of claim 7, said electrochemical deposition apparatus further comprising:
    a workpiece carrier configured to carry a workpiece and position said workpiece proximate to said workpiece contacting surface and said at least one electrical conductor, and
    a power supply coupled to said platen and said workpiece, said power supply configured to apply a relatively negative charge to said workpiece and a relatively positive charge to said platen.

11. A multi-process workpiece apparatus comprising:
an electrochemical deposition apparatus having a platen assembly, said platen assembly comprising a platen, a workpiece contacting surface disposed proximate to said platen, and at least one electrical conductor disposed proximate to said workpiece contacting surface;
a planarization apparatus;
at least one workpiece handling robot configured to transport a workpiece from said electrochemical deposition apparatus to said planarization apparatus; and
an anneal apparatus.

12. The multi-process workpiece apparatus of claim 11, further comprising a cleaning apparatus comprising a carbon dioxide particle cleaner.

13. A multi-process workpiece apparatus comprising:
an electrochemical deposition apparatus having a platen assembly, said platen assembly comprising a platen, a workpiece contacting surface disposed proximate to said platen, and at least one electrical conductor disposed proximate to said workpiece contacting surface;
a planarization apparatus;
at least one workpiece handling robot configured to transport a workpiece from said electrochemical deposition apparatus to said planarization apparatus; and
a seed layer enhancement apparatus.

14. A multi-process workpiece apparatus comprising:
an electrochemical deposition apparatus having a platen assembly, said platen assembly comprising a platen, a workpiece contacting surface disposed proximate to said platen, and at least one electrical conductor disposed proximate to said workpiece contacting surface wherein said electrochemical deposition apparatus is configured to monitor a change in an electrical resistance across a workpiece as a material is deposited thereon during electrochemical deposition;
a planarization apparatus; and
at least one workpiece handling robot configured to transport a workpiece from said electrochemical deposition apparatus to said planarization apparatus.

15. A multi-process workpiece apparatus comprising:
an electrochemical deposition apparatus having a platen assembly, said platen assembly comprising a platen comprising a conductive material, a workpiece contacting surface disposed proximate to said platen, at least one electrical conductor disposed proximate to said workpiece contacting surface, a workpiece carrier configured to carry a workpiece and urge said workpiece against said workpiece contacting surface, and a power supply coupled to said platen and said workpiece, said power supply configured to apply a relatively negative charge to said workpiece and a relatively positive charge to said platen;
a planarization apparatus; and
at least one workpiece handling robot configured to transport a workpiece from said electrochemical deposition apparatus to said planarization apparatus.

16. A multi-process workpiece apparatus comprising:
an electrochemical deposition apparatus having a platen assembly, said platen assembly comprising a platen, a workpiece contacting surface disposed proximate to said platen, and at least one electrical conductor disposed proximate to said workpiece contacting surface;
an electrochemical planarization apparatus configured to monitor a change in an electrical resistance across a workpiece as material is removed therefrom during planarization; and
at least one workpiece handling robot configured to transport a workpiece from said electrochemical deposition apparatus to said electrochemical planarization apparatus.

17. A multi-process workpiece apparatus comprising:
an electrochemical deposition apparatus having a platen assembly, said platen assembly comprising a platen, a workpiece contacting surface disposed proximate to said platen, and at least one electrical conductor disposed proximate to said workpiece contacting surface when said electrochemical deposition apparatus functions to perform planar planing of a film over down feature and field regions on a surface of the workpiece;
a planarization apparatus; and
at least one workpiece handling robot configured to transport a workpiece from said electrochemical deposition apparatus to said planarization apparatus.

18. The multi-process workpiece apparatus of claim 17 wherein a thickness of said film over a top of said field regions is within a range of about 1,000 to 5,000 angstroms.

* * * * *